United States Patent
Shih et al.

(10) Patent No.: US 10,830,982 B2
(45) Date of Patent: *Nov. 10, 2020

(54) AUTOFOCUS SYSTEM

(71) Applicant: Ultimems, Inc., New Taipei (TW)

(72) Inventors: Forster Shih, Taipei (TW); Yee-Chung Fu, Fremont, CA (US)

( * ) Notice: Subject to any disclaimer, the term of this patent is extended or adjusted under 35 U.S.C. 154(b) by 829 days.

This patent is subject to a terminal disclaimer.

(21) Appl. No.: 14/970,538

(22) Filed: Dec. 15, 2015

(65) Prior Publication Data

US 2016/0187614 A1 Jun. 30, 2016

Related U.S. Application Data

(60) Provisional application No. 62/096,854, filed on Dec. 24, 2014.

(51) Int. Cl.
| | |
|---|---|
| *G02B 7/08* | (2006.01) |
| *G02B 27/64* | (2006.01) |
| *G02B 7/02* | (2006.01) |
| *B81B 3/00* | (2006.01) |

(52) U.S. Cl.
CPC .............. *G02B 7/08* (2013.01); *B81B 3/0062* (2013.01); *G02B 7/021* (2013.01); *G02B 27/646* (2013.01); *B81B 2201/047* (2013.01)

(58) Field of Classification Search
CPC ........ G02B 7/08; G02B 7/021; G02B 27/646; B81B 3/0062; B81B 2201/047
See application file for complete search history.

(56) References Cited

U.S. PATENT DOCUMENTS

| | | | | |
|---|---|---|---|---|
| 5,025,346 | A * | 6/1991 | Tang | B81B 3/0021 361/283.1 |
| 6,091,537 | A * | 7/2000 | Sun | B81B 3/0062 359/248 |
| 2004/0198063 | A1* | 10/2004 | Subramanian | B81C 1/00626 438/712 |
| 2008/0198249 | A1* | 8/2008 | Tanimura | H04N 5/2253 348/294 |
| 2008/0240704 | A1* | 10/2008 | Takahashi | G03B 17/00 396/419 |
| 2009/0213236 | A1* | 8/2009 | Chiou | H04N 5/2259 348/208.11 |
| 2010/0156109 | A1* | 6/2010 | Ivanovich | F03D 1/04 290/55 |
| 2010/0284081 | A1* | 11/2010 | Gutierrez | G02B 7/102 359/554 |
| 2013/0077168 | A1* | 3/2013 | Gutierrez | H02N 1/006 359/554 |
| 2013/0293764 | A1* | 11/2013 | Lipson | H04N 5/2257 348/345 |
| 2015/0185976 | A1* | 7/2015 | Jiang | G06F 3/04817 715/834 |
| 2016/0048011 | A1* | 2/2016 | Suzuki | G02B 21/02 348/79 |

* cited by examiner

*Primary Examiner* — Cara E Rakowski
(74) *Attorney, Agent, or Firm* — Chen-Chi Lin

(57) ABSTRACT

An autofocus system is disclosed. The autofocus system includes a lens assembly, an upper actuator, and a lower actuator. The upper and the lower actuators have stationary elements and movable elements. The lens assembly is attached to the movable elements of the upper and the lower actuators. The autofocus system allows three degrees of freedoms of translational adjustments and two degrees of freedoms of rotational adjustments.

18 Claims, 7 Drawing Sheets

AUTOFOCUS SYSTEM

CROSS-REFERENCE TO RELATED APPLICATIONS

This patent application claims benefit of a provisional patent application 62/096,854. The disclosure made in the provisional patent application 62/096,854 is hereby incorporated by reference.

FIELD OF THE INVENTION

This invention relates generally to an autofocus system for a camera module. More particularly, the present invention relates to an autofocus system allowing three degrees of freedoms of translational adjustments and two degrees of freedoms of rotational adjustments.

BACKGROUND OF THE INVENTION

Autofocus is now a standard function in miniature cameras. There is a constant need to improve performance of autofocus. It is advantageous to extend the autofocus technology to include more degrees of freedoms of translational and rotational adjustments.

SUMMARY OF THE INVENTION

This invention discloses an autofocus system that allows three degrees of freedoms of translational adjustments and two degrees of freedoms of rotational adjustments. The autofocus system includes a lens assembly, an upper actuator, and a lower actuator. The upper and the lower actuators have stationary elements and movable elements. The lens assembly is attached to the movable elements of the upper and the lower actuators. In addition to improving the autofocus function, the capabilities of the translational adjustments and the rotational adjustments may balance the shock and vibration induced by user's hands. Thus, the steady-shot function of the camera module is also improved.

DETAILED DESCRIPTION OF THE INVENTION

Figure 1:
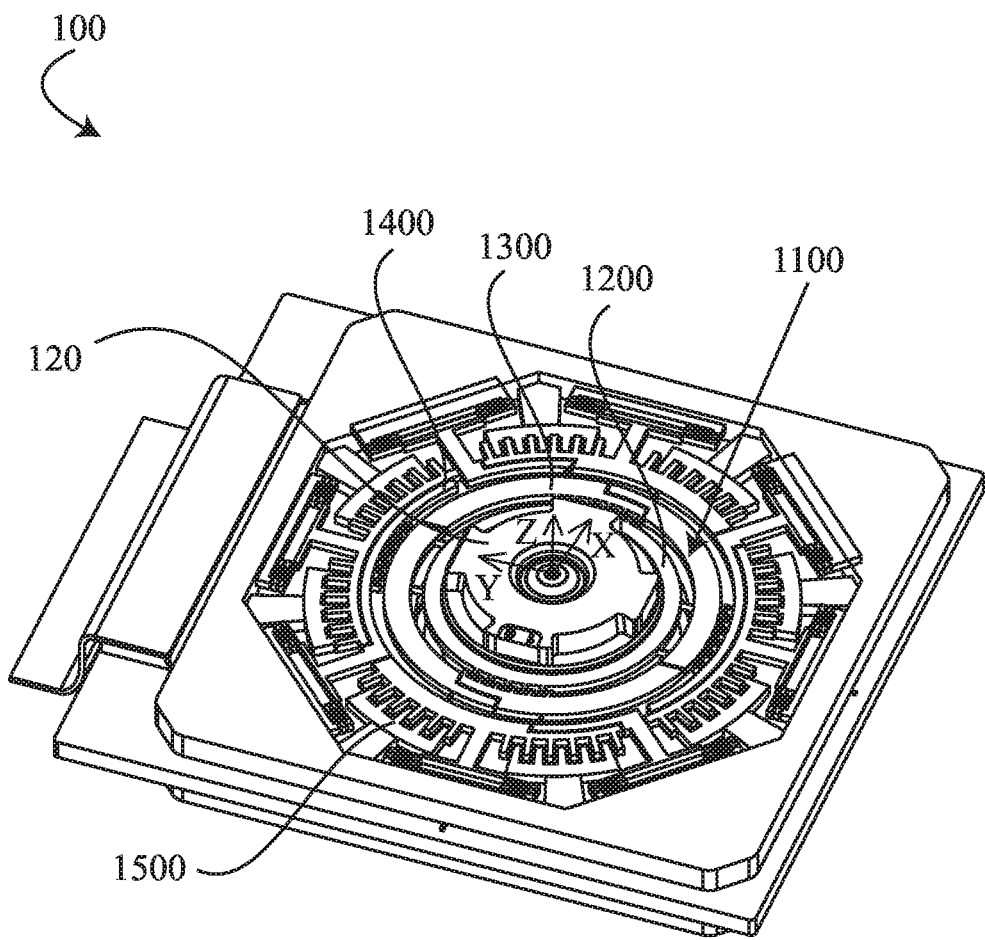
FIG. 1 is a schematic perspective view of an autofocus system in examples of the present disclosure.
Figure 2:
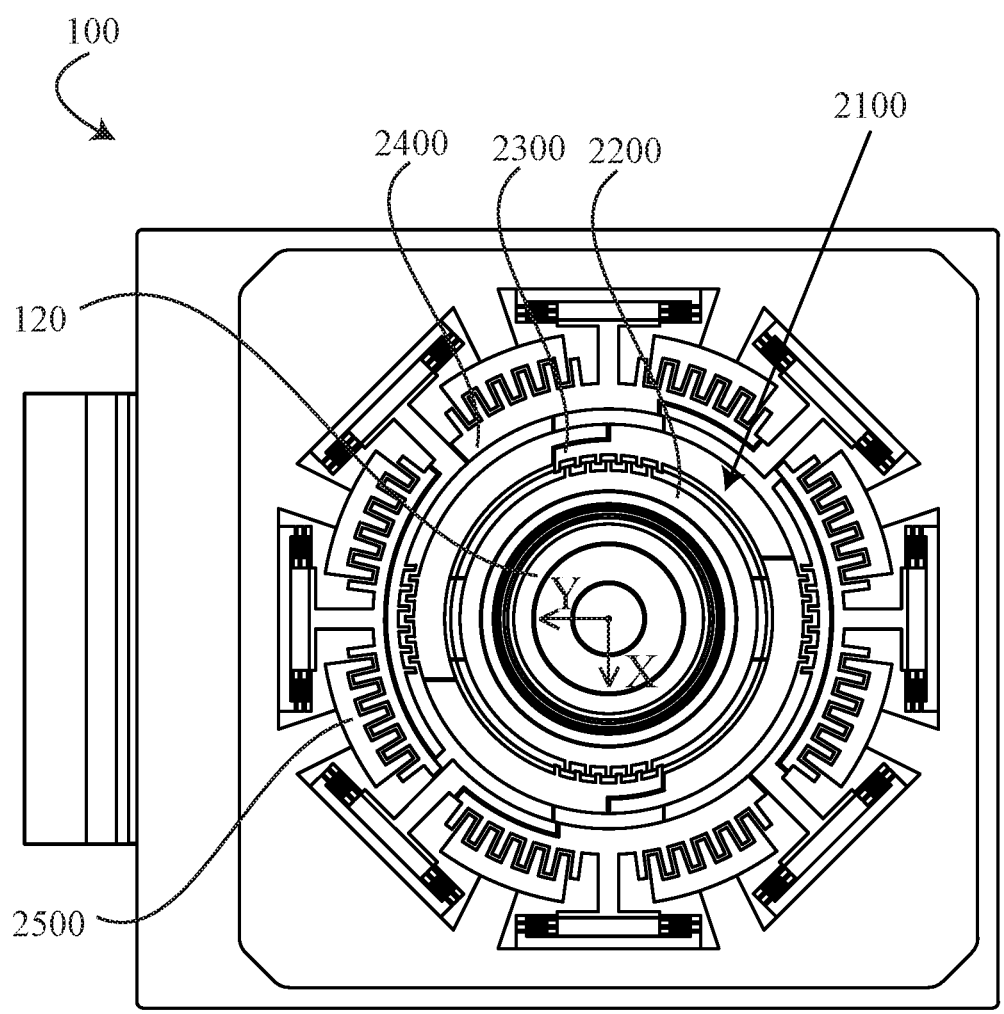
FIG. 2 is a bottom view of the autofocus system of FIG. 1.

FIG. 1 is a schematic perspective view of an autofocus system 100 in examples of the present disclosure. FIG. 2 is a bottom view of autofocus system 100 of FIG. 1. As shown in FIG. 1 and FIG. 2, autofocus system 100 includes a lens assembly 120, an upper actuator 1100 and a lower actuator 2100. Upper actuator 1100 includes one or more upper stationary elements 1500, a first upper translation element 1200 to translate along X direction, a second upper translation element 1300 to translate along Y direction, and a third upper translation element 1400 to translate along Z direction. Lower actuator 2100 includes one or more lower stationary elements 2500, a first lower translation element 2200 to translate along X direction, a second lower translation element 2300 to translate along Y direction, and a third lower translation element 2400 to translate along Z direction. Lens assembly 120 may attach to first upper translation element 1200 and first lower translation element 2200.

In examples of the present disclosure, the translations of translation elements 1200, 1300, 1400, 2200, 2300, and 2400 may be driven by electrostatic comb drives.

In examples of the present disclosure, lens assembly 120 moves along positive X direction when first upper translation element 1200 and first lower translation element 2200 translate a positive displacement along X axis. Lens assembly 120, first upper translation element 1200 and first lower translation element 2200 move along positive Y direction when second upper translation element 1300 and second lower translation element 2300 translate a positive displacement along Y axis. Lens assembly 120, first upper translation element 1200, first lower translation element 2200, second upper translation element 1300 and second lower translation element 2300 move along positive Z direction when third upper translation element 1400 and third lower translation element 2400 translate a positive displacement along Z axis.

In examples of the present disclosure, lens assembly 120 rotates about an axis parallel to Y axis when first upper translation element 1200 translates a positive displacement along X axis and first lower translation element 2200 translates a negative displacement along X axis. Lens assembly 120, first upper translation element 1200 and first lower translation element 2200 rotates about an axis parallel to X axis when second upper translation element 1300 translates a negative displacement along Y axis and second lower translation element 2300 translates a positive displacement along Y axis.

In one example, lens assembly 120 includes a single lens. In another example, lens assembly 120 includes a barrel and one or more lenses.

Figure 3:
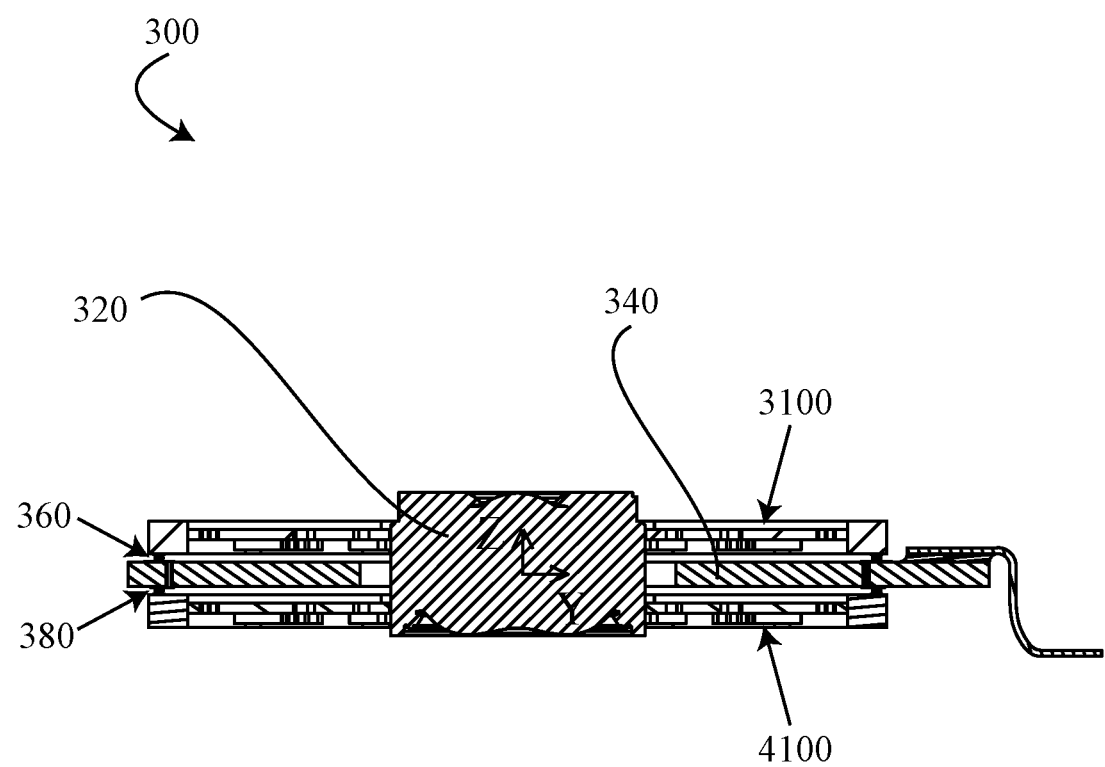
FIG. 3 is a cross-sectioned view of another autofocus system in examples of the present disclosure.

FIG. 3 is a cross-sectioned view of another autofocus system 300 in examples of the present disclosure. Autofocus system 300 includes a lens assembly 320, an upper actuator 3100, a lower actuator 4100, and a substrate 340. Substrate 340 may be located between upper actuator 3100 and lower actuator 4100. Substrate 340 may have an annular opening to receive lens assembly 320. A first set of solder balls 360 may connect substrate 340 and upper actuator 3100. A second set of solder balls 380 may connect substrate 340 and lower actuator 4100.

Figure 4:
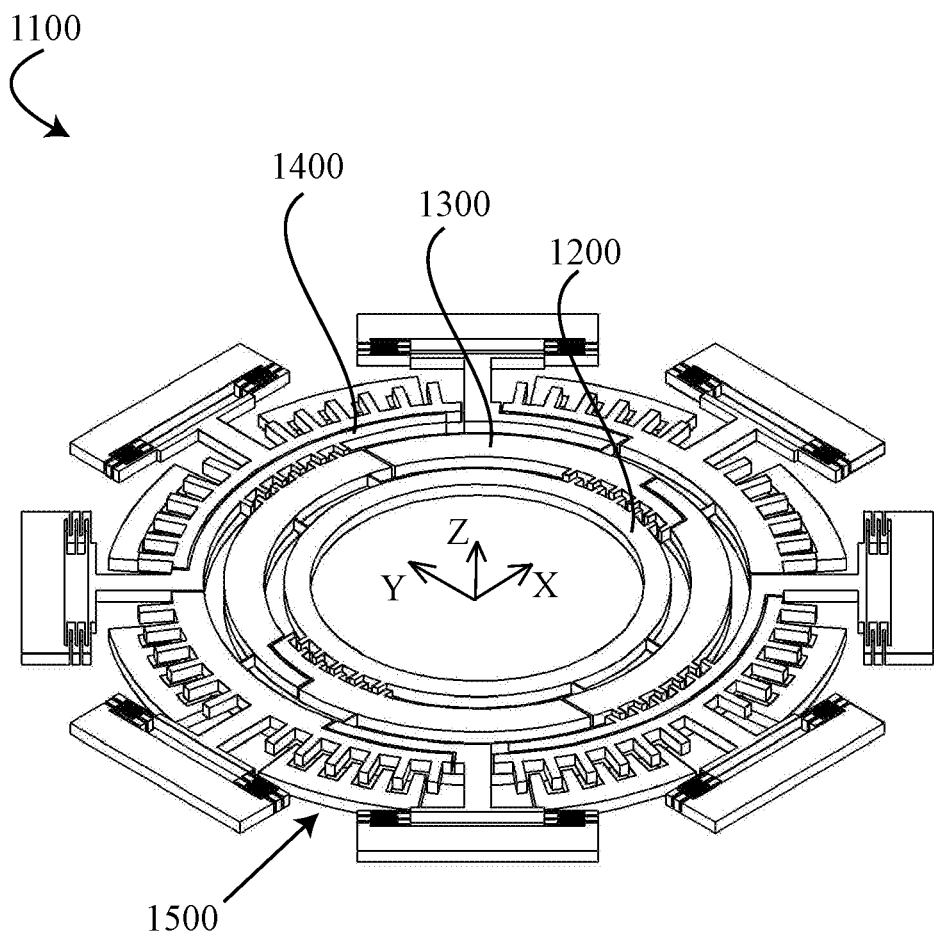
FIG. 4 is a schematic perspective view of an actuator in examples of the present disclosure.

FIG. 4 is a schematic perspective view of an actuator 1100 in examples of the present disclosure. Actuator 1100 includes one or more stationary elements 1500, a first translation element 1200 to translate along X direction, a second translation element 1300 to translate along Y direction, and a third translation element 1400 to translate along Z direction.

In examples of the present disclosure, first translation element 1200, second translation element 1300, and third translation element 1400 are in cylindrical shapes and have the same central axis (Z axis). In one example, the radius of first translation element 1200 is smaller than the radius of second translation element 1300 and the radius of second translation element 1300 is smaller than the radius of third translation element 1400. In another example, the radius of first translation element 1200 is larger than the radius of second translation element 1300 and the radius of third translation element 1400 is larger than the radius of first translation element 1200.

Figure 5:
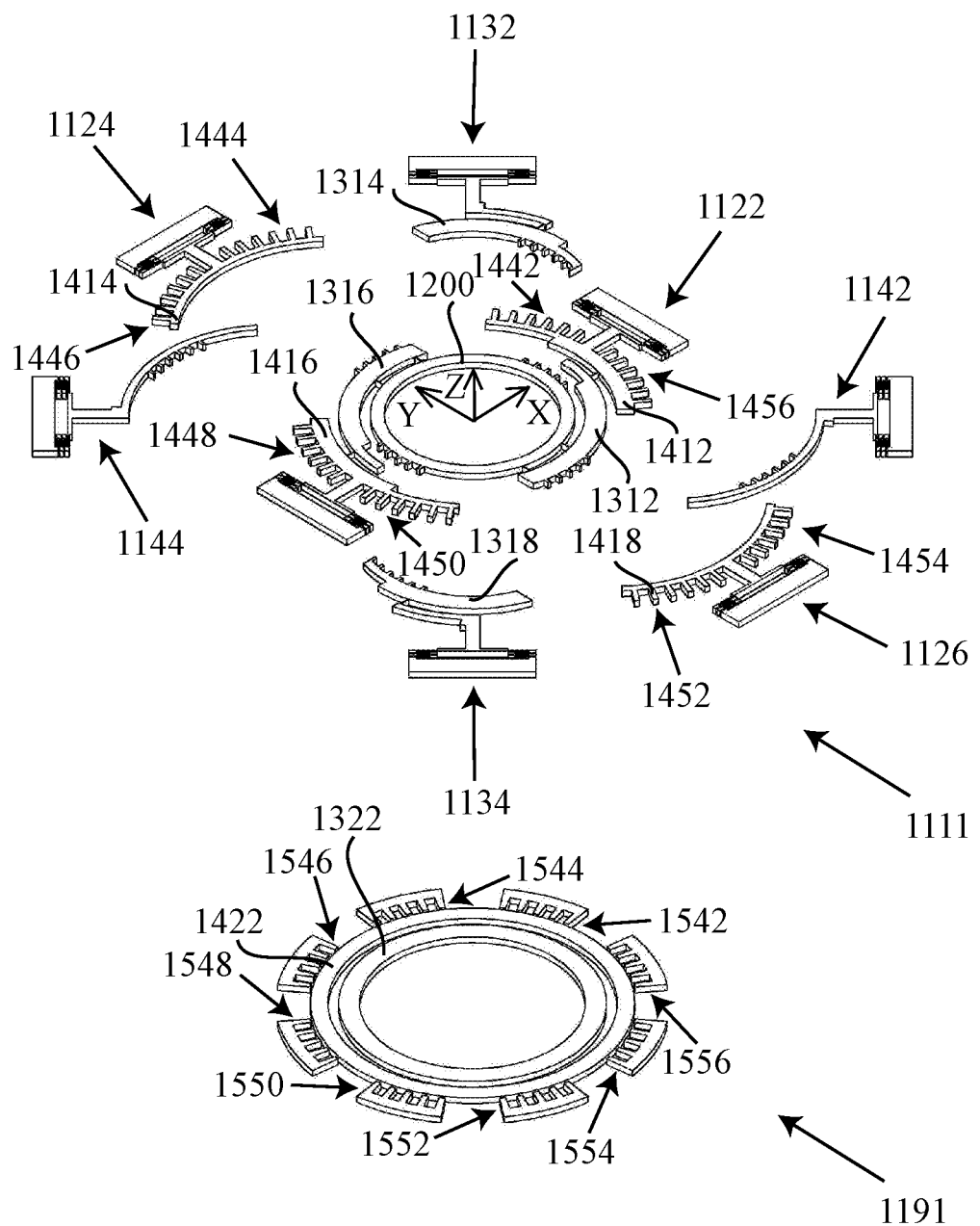
FIG. 5 is an exploded plot of the actuator of FIG. 4.
Figure 7:
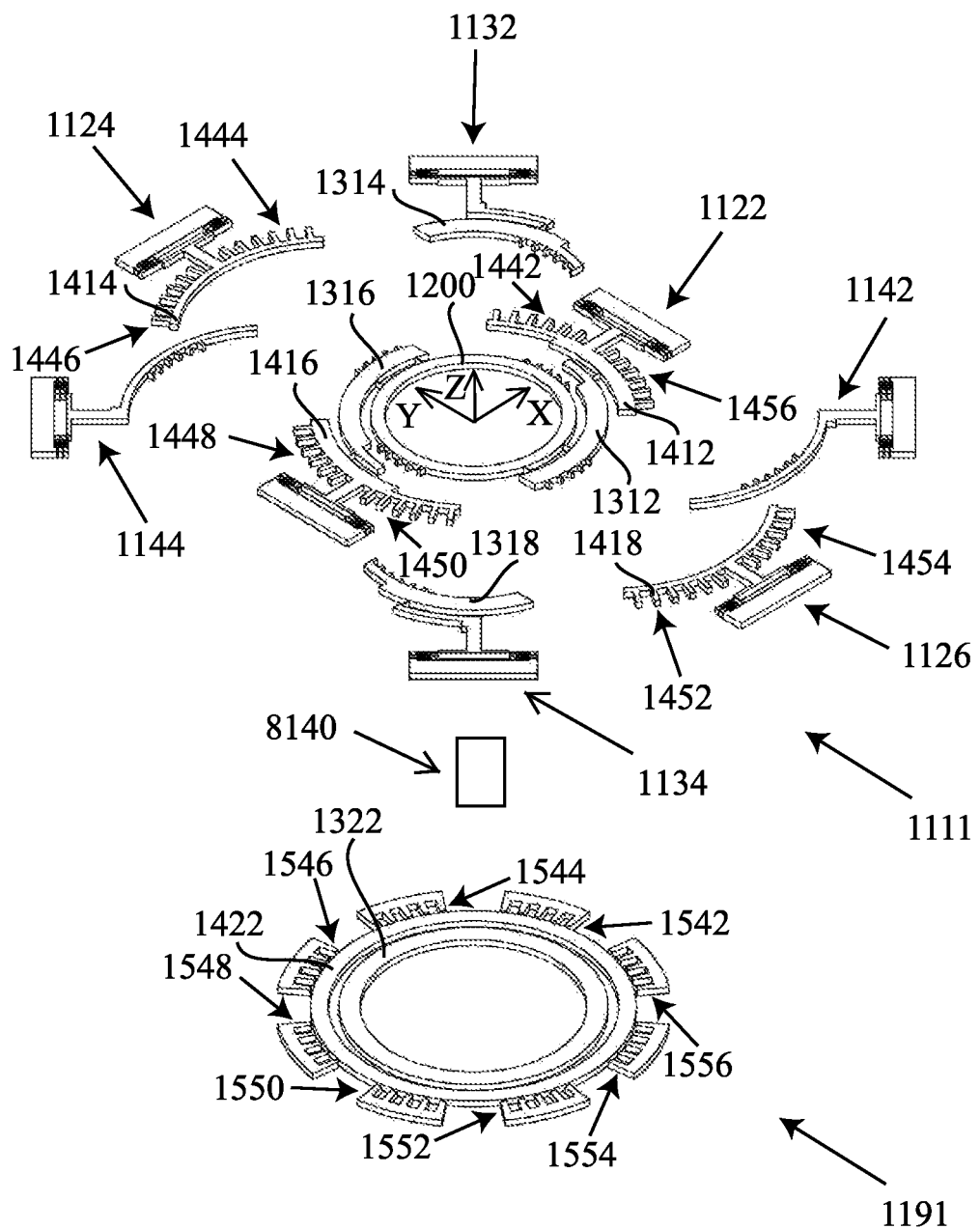
FIG. 7 is an exploded plot of another actuator in examples of the present disclosure.

FIG. 5 is an exploded plot of actuator 1100 of FIG. 4. Actuator 1100 may include a top layer 1111 and a bottom layer 1191. In one example, top layer 1111 is attached to bottom layer 1191. In another example, top layer 1111 is attached to a middle layer (for example, 8140 of FIG. 7) and the middle layer is attached to bottom layer 1191. In examples of the present disclosure, top layer 1111 and bottom layer 1191 are made of silicon and middle layer is made of silicon oxide. FIG. 7 is a variation of FIG. 5. Top layer 1111 is attached to a middle layer 8140 and the middle layer is attached to bottom layer 1191.

Top layer 1111 may include ground electrode member 1122, ground electrode member 1124, ground electrode member 1126, X-driving electrode member 1132, X-driving electrode member 1134, Y-driving electrode member 1142, and Y-driving electrode member 1144. Ground electrode members 1122, 1124, and 1126 connect to ground. X-driving electrode members 1132 and 1134 connect to driving voltage potentials. Y-driving electrode members 1142 and 1144 connect to driving voltage potentials.

Bottom layer 1191 may include Z-driving electrodes 1542, 1544, 1546, 1548, 1550, 1552, 1554, and 1556, support ring 1322, and support ring 1422.

First translation element 1200 may be in top layer 1111. Second translation element 1300 may include arc member 1312, arc member 1314, arc member 1316, and arc member 1318 in top layer 1111 and support ring 1322 in bottom layer 1911. Third translation element 1400 may include arc member 1412, arc member 1414, arc member 1416, and arc member 1418 in top layer 1111 and support ring 1422 in bottom layer 1911.

In examples of the present disclosure, moving electrodes 1442, 1444, 1446, 1448, 1450, 1452, 1454, and 1456 are engaged with Z-driving electrodes 1542, 1544, 1546, 1548, 1550, 1552, 1554, and 1556 to form eight out-of-plane comb drives.

Figure 6:
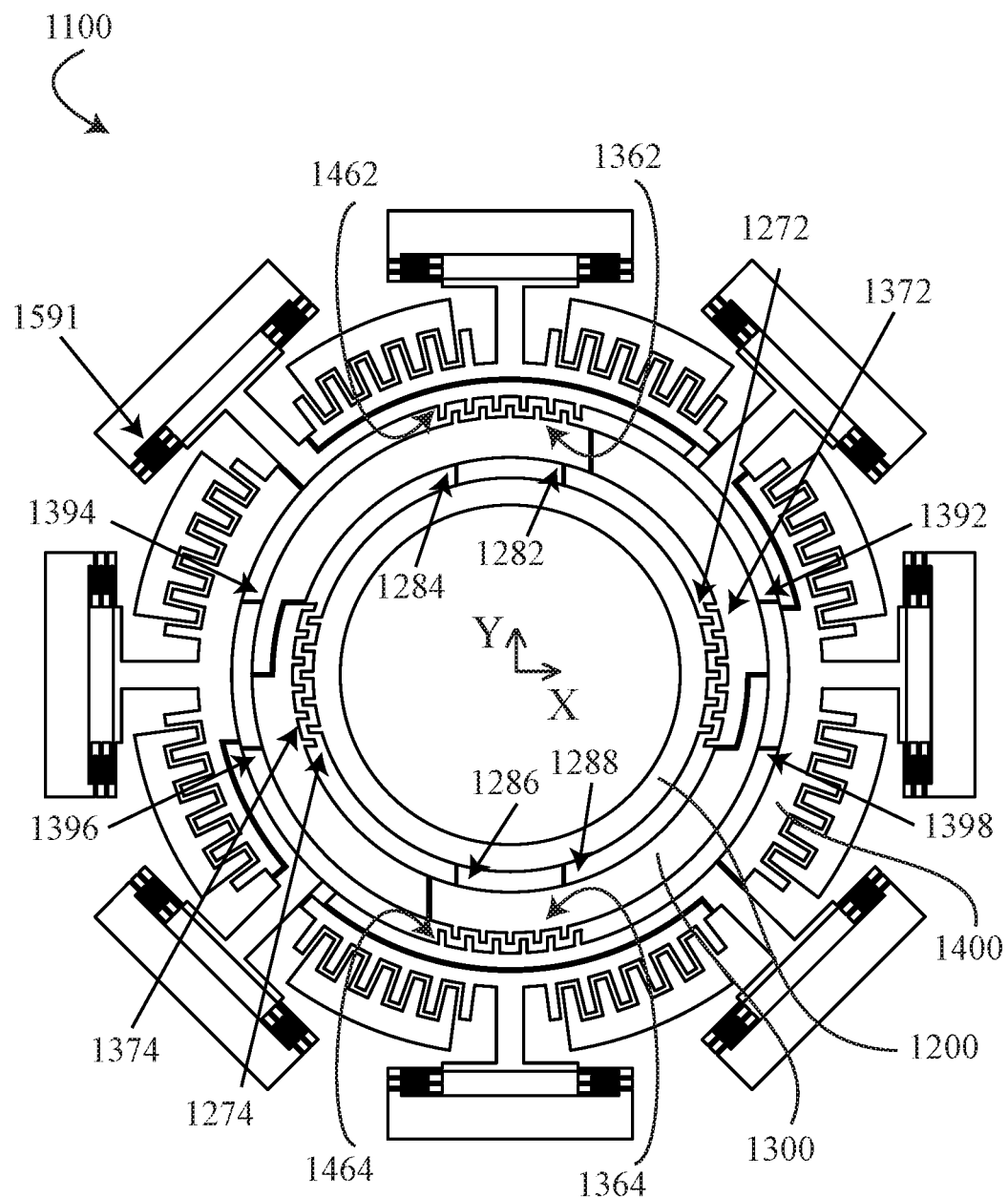
FIG. 6 is a top view of the actuator of FIG. 4.

FIG. 6 is a top view of actuator 1100 of FIG. 4. Actuator 1100 further includes X-translational springs 1282, 1284, 1286, and 1288, Y-translational springs 1392, 1394, 1396, and 1398, and one or more Z-translational springs 1591. X-translational springs 1282, 1284, 1286, and 1288 connect first translation element 1200 and second translation element 1300. Y-translational springs 1392, 1394, 1396, and 1398 connect second translation element 1300 and third translation element 1400.

Moving electrodes 1272 and 1274 extending from first translation element 1200 are engaged with X-driving electrodes 1372 and 1374 extending from second translation element 1300 to form two in-plane comb drives. Moving electrodes 1362 and 1364 extending from second translation element 1300 are engaged with Y-driving electrodes 1462 and 1464 extending from third translation element 1400 to form two in-plane comb drives.

Those of ordinary skill in the art may recognize that modifications of the embodiments disclosed herein are possible. For example, the numbers of springs may vary; the springs may be linear springs, serpentine springs, or other kinds of springs; the numbers of comb drives may vary; and the numbers and the shapes of the comb teeth of the comb drives may vary. Other modifications may occur to those of ordinary skill in this art, and all such modifications are deemed to fall within the purview of the present invention, as defined by the claims.

The invention claimed is:

1. An autofocus system, comprising:
   a lens assembly;
   an upper actuator comprising:
     one or more upper stationary elements;
     a first upper translation element to translate along a first direction;
     a second upper translation element to translate along a second direction perpendicular to the first direction; and
     a third upper translation element to translate along a third direction perpendicular to the first and the second directions;
   a lower actuator comprising:
     one or more lower stationary elements;
     a first lower translation element to translate along the first direction;
     a second lower translation element to translate along the second direction; and
     a third lower translation element to translate along the third direction;
   one or more first upper comb drives operative to drive the first upper translation element to translate along the first direction;
   one or more second upper comb drives operative to drive the first upper translation element and the second upper translation element to translate along the second direction; and
   one or more third upper comb drives operative to drive the first upper translation element, the second upper translation element and the third upper translation element to translate along the third direction;
   wherein the lens assembly is attached to the first upper translation element of the upper actuator and the first lower translation element of the lower actuator.

2. The autofocus system of claim 1, wherein the translations of translation elements are driven by electrostatic comb drives.

3. The autofocus system of claim 1, wherein the lens assembly rotates about an axis parallel to the second direction when the first upper translation element translates a positive displacement along the first direction and the first lower translation element translates a negative displacement along the first direction.

4. The autofocus system of claim 1, further comprising a substrate located between the upper actuator and the lower actuator, the substrate having an annular opening to receive the lens assembly.

5. The autofocus system of claim 4, further comprising a first set of solder balls and a second set of solder balls, wherein the first set of solder balls connect the substrate and the upper actuator and the second set of solder balls connect the substrate and the lower actuator.

6. The autofocus system of claim 1, wherein the lens assembly comprises a single lens.

7. The autofocus system of claim 1, wherein the lens assembly comprises a barrel and one or more lenses.

8. The autofocus system of claim 1, wherein the second upper translation element has an annular opening to receive the first upper translation element;
   wherein the third upper translation element has an annular opening to receive the second upper translation element;
   wherein a radius of the first upper translation element is smaller than a radius of the second upper translation element;

wherein the radius of second upper translation element is smaller than a radius of the third upper translation element; and wherein a radius of the annular opening of the second upper translation element is smaller than a radius of the annular opening of the third upper translation element.

9. The autofocus system of claim 1, wherein the lens assembly moves along the first direction when the first upper translation element and the first lower translation element translate a positive displacement along the first direction;

the lens assembly, the first upper translation element and the first lower translation element move along positive the second direction when the second upper translation element and the second lower translation element translate a positive displacement along the second direction; and the lens assembly, the first upper translation element, the first lower translation element, the second upper translation element and the second lower translation element move along the third direction when the third upper translation element and the third lower translation element translate a positive displacement along the third direction.

10. An autofocus actuator, comprising:
one or more stationary elements;
a first translation element to translate along a first direction;
a second translation element to translate along a second direction perpendicular to the first direction;
a third translation element to translate along a third direction perpendicular to the first and the second directions;
first relatively stationary electrodes extending from the second translation element;
second relatively stationary electrodes extending from the third translation element;
stationary electrodes extending from the one or more stationary elements;
first movable electrodes extending from the first translation element and being interdigitated with the first relatively stationary electrodes to form one or more first comb drives;
second movable electrodes extending from the second translation element and being interdigitated with the second relatively stationary electrodes to form one or more second comb drives; and
third movable electrodes extending from the third translation element and being engaged with the stationary electrodes to form one or more third comb drives;
wherein the translations of translation elements are driven by electrostatic comb drives.

11. The autofocus actuator of claim 10, wherein the one or more first comb drives and the one or more second comb drives are in-plane comb drives and the one or more third comb drives are out-of-plane comb drives.

12. The autofocus actuator of claim 10, further comprising one or more first springs, one or more second springs, and one or more third springs, wherein
the first translation element is coupled by the one or more first springs to the second translation element;
the second translation element is coupled by the one or more second springs to the third translation element; and
the third translation element is coupled by the one or more third springs to the one or more stationary elements.

13. The autofocus actuator of claim 10, wherein the first translation element is electrically connected to ground.

14. The autofocus actuator of claim 10, wherein the second translation element comprises
a top layer comprising
one or more first components electrically connected to ground;
one or more second components electrically connected to one or more driving voltage potentials;
wherein the one or more first component and the one or more second component are separated by one or more gaps;
a middle insulation layer; and
a bottom supporting layer.

15. The autofocus actuator of claim 10, wherein the third translation element comprises
a top layer comprising
one or more first components electrically connected to ground;
one or more second components electrically connected to one or more driving voltage potentials;
wherein the one or more first component and the one or more second component are separated by one or more gaps;
a middle insulation layer; and
a bottom supporting layer.

16. The autofocus actuator of claim 10, wherein the second translation element has an annular opening to receive the first translation element;
wherein the third translation element has an annular opening to receive the second translation element;
wherein a radius of the first translation element is smaller than a radius of the second translation element;
wherein the radius of second translation element is smaller than a radius of the third translation element; and
wherein a radius of the annular opening of the second translation element is smaller than a radius of the annular opening of the third translation element.

17. The autofocus actuator of claim 16, wherein the autofocus actuator is characterized by a top layer and a bottom layer;
wherein an entirety of the first translation element is in the top layer;
wherein a plurality of arc members of the second translation element are in the top layer and a support ring of the second translation element is in the bottom layer; and
wherein a plurality of arc members of the third translation element are in the top layer and a support ring of the third translation element is in the bottom layer.

18. An autofocus actuator, comprising:
one or more stationary elements;
a first translation element to translate along a first direction;
a second translation element to translate along a second direction perpendicular to the first direction; and
a third translation element to translate along a third direction perpendicular to the first and the second directions;
wherein the translations of translation elements are driven by electrostatic comb drives;
wherein the second translation element has an annular opening to receive the first translation element; and wherein the third translation element has an annular opening to receive the second translation element.

* * * * *